(12) United States Patent
Kim et al.

(10) Patent No.: US 8,716,777 B2
(45) Date of Patent: May 6, 2014

(54) SEMICONDUCTOR DEVICE AND METHOD FOR MANUFACTURING THE SAME

(71) Applicant: SK Hynix Inc., Icheon (KR)

(72) Inventors: Sung Soo Kim, Suwon (KR); Na Hye Won, Busan (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/649,890

(22) Filed: Oct. 11, 2012

(65) Prior Publication Data

US 2013/0320558 A1 Dec. 5, 2013

(30) Foreign Application Priority Data

May 30, 2012 (KR) .................. 10-2012-0057432

(51) Int. Cl.
*H01L 21/28* (2006.01)

(52) U.S. Cl.
USPC ..... 257/302; 257/330; 257/332; 257/E29.262

(58) Field of Classification Search
USPC .......... 257/302, 330, 334, E29.262; 438/586, 438/587, 589
See application file for complete search history.

(56) References Cited

U.S. PATENT DOCUMENTS

| 8,247,324 B2* | 8/2012 | Shin et al. ............. 438/672 |
| 8,461,687 B2* | 6/2013 | Cho et al. ............. 257/773 |
| 8,659,111 B2* | 2/2014 | Kim et al. ............. 257/499 |
| 2011/0156135 A1* | 6/2011 | Yoon et al. ............. 257/330 |

* cited by examiner

*Primary Examiner* — Roy Potter

(57) ABSTRACT

A method for forming a semiconductor device includes forming a sealing insulation film over a semiconductor substrate including a device isolation film and an active region, forming a bit line contact plug that protrudes from an upper part of the sealing insulation film and is coupled to the active region, forming a spacer over a sidewall of the protruded bit line contact plug, and forming a bit line coupled to an upper part of the bit line contact plug.

18 Claims, 4 Drawing Sheets

SEMICONDUCTOR DEVICE AND METHOD FOR MANUFACTURING THE SAME

CROSS-REFERENCE TO RELATED APPLICATION

The priority of Korean patent application No. 10-2012-0057432 filed on 30 May 2012, the disclosure of which is hereby incorporated in its entirety by reference, is claimed.

BACKGROUND OF THE INVENTION

Embodiments of the present invention relate to a semiconductor device, and more particularly to a semiconductor device and a method for forming the same.

Most modern electronic appliances comprise a semiconductor device. A semiconductor device comprises electronic elements such as a transistor, a resistor and a capacitor. These electronic elements are designed to perform partial functions of electronic appliances, and are integrated on a semiconductor substrate. For example, electronic elements such as a computer or a digital camera include a memory chip for storing information and a processing chip for processing information. Memory chips and processing chips include electronic elements integrated on a semiconductor substrate.

Semiconductor devices have a need for a higher degree of integration in order to satisfy consumer demands for superior performance and lower prices. Such an increase in the degree of integration of a semiconductor device entails a reduction in a design rule, causing patterns of a semiconductor device to be reduced accordingly. Although an entire chip area may be increased in proportion to an increase in a memory capacity as semiconductor devices become super miniaturized and highly integrated, an area of a cell area where patterns of a semiconductor device are formed may be decreased. Accordingly, since a greater number of patterns are formed in a limited cell area in order to achieve a desired memory capacity, there is a need for formation of microscopic (fine) patterns having a reduced critical dimension.

A dynamic random access memory (DRAM) device includes a plurality of unit cells each having a capacitor and a transistor. The capacitor is used to temporarily store data, and the transistor is used to transfer data between a bit line and the capacitor in response to a control signal (word line). The data transfer occurs by using a semiconductor property where electrical conductivity changes depending on doping characteristics. The transistor has three regions; a gate, a source, and a drain. Electric charges move between the source and the drain according to a control signal input to the gate of the transistor. The movement of the electric charges between the source and the drain is achieved through a channel region. The channel is doped to facilitate moving the charges.

In a typical method for manufacturing a transistor, a gate is formed in a semiconductor substrate, and a source and a drain are formed by doping impurities into both sides of the gate. In this case, a channel region of the transistor is defined between the source and the drain under the gate. A transistor having a horizontal channel region occupies a predetermined area of a semiconductor substrate. Therefore, for a given transistor, the number of memory cells may determine the size of the semiconductor device.

If the total area of the semiconductor memory device is reduced, the number of semiconductor memory devices per wafer is increased, thereby improving the productivity. Several methods for reducing the total area of the semiconductor memory device have been proposed. One method is to replace a conventional planar gate having a horizontal channel region with a recess gate in which a recess is formed in a substrate and a channel region is formed along a curved surface of the recess by forming a gate in the recess. Furthermore, a buried gate has been studied which can reduce parasitic capacitance of a bit line by burying the entire gate within the recess.

In a semiconductor device including a buried gate, a bit line contact plug is coupled to an active region of the semiconductor substrate which includes the buried gate. A method for forming a general bit line contact plug will hereinafter be described in detail.

An interlayer insulation film is formed over a semiconductor substrate including a buried gate, and the interlayer insulation film is etched to expose an active region so that a bit line contact hole is formed. In this case, a lower part of the bit line contact hole is formed to provide an interface sufficient to communicate with an active region. Subsequently, after a conductive layer is formed over the insulation film including a bit line contact hole, the conductive layer is etched back so that a bit line contact plug is formed.

However, during the etch-back process, the bit line contact plug may be etched so that it has a lower height than the interlayer insulation film, creating a step difference between the bit line contact plug and the surface of the interlayer insulation film. As a result, in a subsequent process for depositing a bit line barrier metal, an oxide material is rapidly generated between the bit line contact plug and the barrier metal. In addition, poor step coverage of the barrier metal may occur due to the step difference, and the bit line contact plug may be damaged when the bit line contact hole is small in size or is misaligned. As a result, resistance of the bit line contact plug is increased, resulting in an increase in the number of defective elements.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device and a method for manufacturing the same, which can solve problems of the related art in which a bit line contact plug has a lower height than an interlayer insulation film formed over a sidewall of the bit line contact plug so as to rapidly generate an oxide material between a subsequent bit line barrier metal and the bit line contact plug, and the bit line contact plug is damaged when a poor step coverage of the bit line barrier metal is formed or misalignment occurs so that contact resistance is increased.

In accordance with an aspect of the present invention, a semiconductor device may include a semiconductor substrate including a device isolation film and an active region; a bit line contact plug protruding from an upper surface of a sealing insulation film formed over the semiconductor substrate, and coupled to the active region; a spacer formed over a sidewall of the protruding bit line contact plug; and a bit line coupled to an upper portion of the bit line contact plug.

The semiconductor may further include a trench formed in the semiconductor substrate; and a buried gate disposed in the trench.

The semiconductor device may further include a mask insulation film formed to define the trench over the semiconductor substrate.

The sealing insulation film may include a nitride film.

The spacer may include a nitride film.

A width of an upper portion of the contact plug disposed over the sealing insulation film may be greater than a width of a lower portion of the contact plug.

The spacer may have a triangular shape, and an outer surface of the spacer may be disposed at an incline with respect to the sealing insulation film.

In accordance with another aspect of the present invention, a method for forming a semiconductor device may include forming a sealing insulation film over a semiconductor substrate including a device isolation film and an active region; forming a bit line contact plug protruding from an upper part of the sealing insulation film and coupled to the active region; forming a spacer over a sidewall of the bit line contact plug; and forming a bit line coupled to the bit line contact plug.

The method may further include before forming the sealing insulation film, forming a mask insulation film over the semiconductor substrate; forming a trench in the semiconductor substrate using the mask insulation film as a mask; and forming a buried gate in the trench.

The sealing insulation film may be further formed over the buried gate.

The sealing insulation film may include a nitride film.

The forming of the bit line contact plug may include: forming a sacrificial insulation film over the sealing insulation film; forming a bit line contact hole by etching the sacrificial insulation film and the sealing insulation film until the active region is exposed; and forming a conductive material in the bit line contact hole; etching back the conductive material to form the bit line contact plug; and removing the sacrificial insulation film.

The bit line contact hole may be etched so that an upper portion of the contact hole has a greater width than a lower portion of the contact hole.

The sacrificial insulation film may include an oxide film.

The sacrificial insulation film may be formed to have a thickness of 400 Å.

The sacrificial insulation film may be removed using a hydrogen fluoride (HF).

The forming of the spacer at a sidewall of the protruded bit line contact plug may include forming a spacer insulation film over the sealing insulation film including the bit line contact plug; and etching back the spacer insulation film.

The spacer insulation film may include a nitride film.

The spacer insulation film may be etched until a triangular shaped portion of the insulation film remains over sidewalls of the spacer, and an outer surface of the spacer is disposed at an incline with respect to the sealing insulation film It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
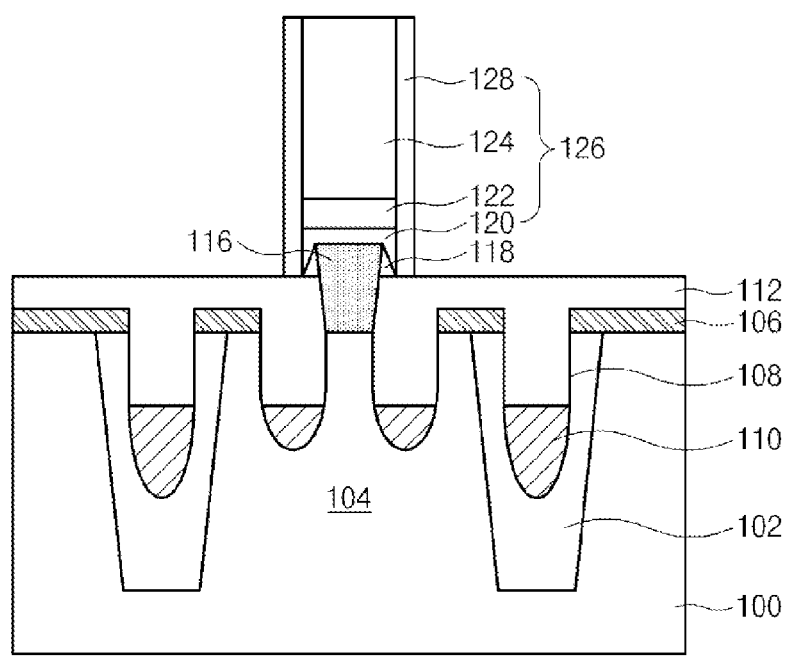
FIG. 1 is a cross-sectional view illustrating a semiconductor device according to the present invention.

FIG. 1 is a cross-sectional view illustrating a semiconductor device according to the present invention.

Referring to FIG. 1, the semiconductor device includes a semiconductor substrate 100 including a device isolation film 102 and an active region 104; a bit line contact plug 116 protruded from a sealing insulation film 112 formed over the semiconductor substrate 100, and coupled to the active region 104; a spacer 118 formed over a sidewall of the bit line contact plug 116; and a bit line 126 coupled to an upper part of the bit line contact plug 116.

In addition, a mask insulation film 106 defining a trench 108 is formed over the semiconductor substrate 100, and a buried gate 110 buried in the trench 108 and a bit line spacer 128 formed over a sidewall of the bit line 126 are also formed over the semiconductor substrate 100.

In an embodiment, the bit line 126 may include a barrier metal layer 120 coupled to the bit line contact plug 116, a bit line metal layer 122, and a hard mask layer 124. In an embodiment, the sealing insulation film 112 may include a nitride film, and the mask insulation film 106 may include an oxide film.

In accordance with an embodiment of the present invention, the bit line contact plug 116 protrudes from the surface of the sealing insulation film 112 formed over the semiconductor substrate 100, such that it can prevent the problem of the related art in which the barrier metal layer 122 is oxidized because an upper surface of the bit line contact plug 116 is lower than an upper surface of the sealing insulation film 112.

In a conventional semiconductor, the upper surface of a bit line contact plug 116 may be below the upper surface of a surrounding insulation film, resulting in a step difference, or a shallow hole. This hole could retain contaminants, resulting in a number of defects. In contrast, in embodiments of the present invention, the upper surface of bit line contact plug 116 protrudes above the surface of surrounding sealing insulation film 112. Furthermore, outer surfaces of spacer 118 may be disposed at a non-normal angle, providing a more gradual, sloped transition between the upper surface of bit line contact 116 and the upper surface of sealing film 112. The sloped transition prevents contaminants from being trapped when barrier metal layer 120 is formed. In addition, smoothing out what would otherwise be an abrupt transition increases the step coverage of barrier metal layer 120 in that region. The protruded bit line contact plug structure can easily clean the surface of the bit line contact plug 116 so as to remove a residue from an upper part of the bit line contact plug 116, such that the semiconductor device according to the present invention can prevent resistance of the bit line contact plug from increasing.

A method for forming the above-mentioned semiconductor device will hereinafter be described with reference to FIGS. 2A to 2F.

FIGS. 2A to 2F illustrate a method for forming a semiconductor device according to an embodiment of the present invention. FIGS. 2A to 2F include cross-sectional views illustrating a semiconductor device manufactured according to an embodiment of the present invention.

Figure 2A:
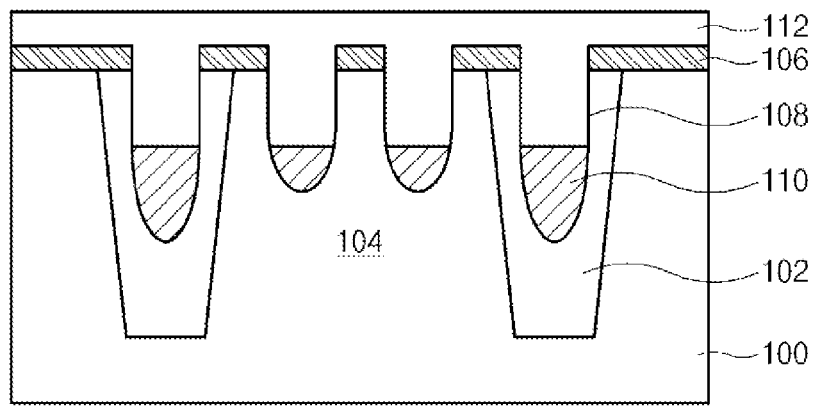
FIGS. 2A to 2F illustrate a method for forming a semiconductor device according to the present invention.

Referring to FIG. 2A, a mask insulation film 106 is formed over the semiconductor substrate 100 including an active region 104 defined by a device isolation film 102. Subsequently, the semiconductor substrate 100 is etched using the mask insulation film 106 as an etch mask so that a trench 108 is formed. Thereafter, after a metal material is formed in the trench 108. The resultant metal material is etched back, so that a buried gate 110 is formed at the bottom of the trench 108. Then, a sealing insulation film 112 is formed over the buried gate 110 and the mask insulation film 106. In an embodiment, the sealing insulation film 112 may include a nitride film.

Figure 2B:
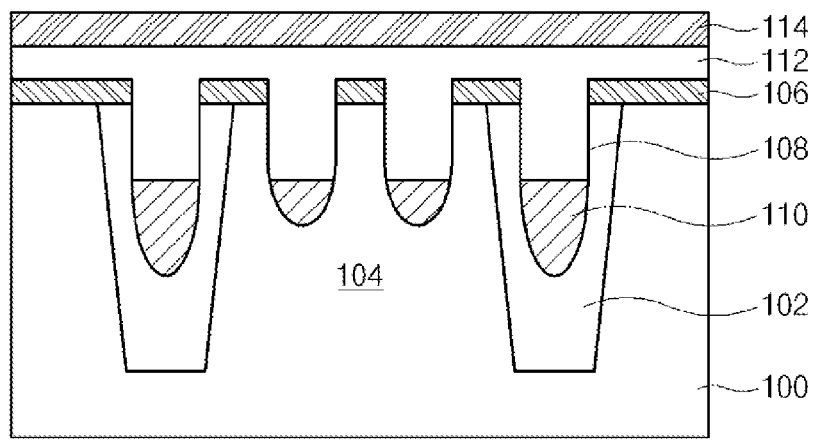

Referring to FIG. 2B, a sacrificial insulation film 114 is formed over the sealing insulation film 112. In an embodiment, the sacrificial insulation film 114 may include Tetra Ethyl Ortho Silicate (TEOS) and have a thickness of 400 Å. However, the thickness of the sacrificial insulation film 114 is not limited thereto. In an embodiment, a bit line contact plug (not shown) to be formed in a subsequent process may have a predetermined thickness through which the bit line contact plug can protrude from the surface of the sealing insulation film 112.

Figure 2C:
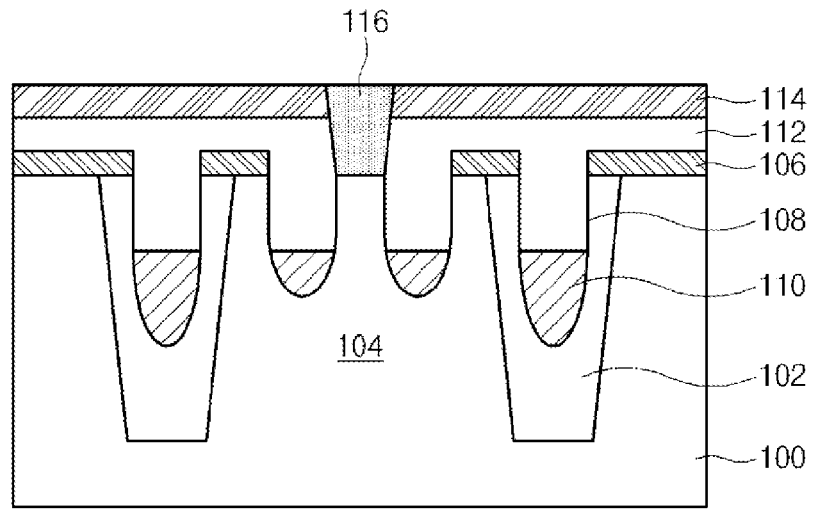

Referring to FIG. 2C, after a photoresist pattern (not shown) defining the bit line contact plug is formed over the sacrificial insulation film 114, the sacrificial insulation film 114 and the sealing insulation film 112 are etched using a photoresist pattern (not shown) as a mask so that a bit line contact hole is formed. In an embodiment, as seen in FIG. 2C, the etching may be performed so that the sidewalls are tapered, where an upper width of the contact hole is greater than a lower width of the contact hole. Subsequently, after a conductive material is formed over the sacrificial insulation film 114 filling the bit line contact hole, the conductive material is etched back so that a bit line contact plug 116 is formed. In embodiments with tapered contact hole sidewalls, upper sidewalls of the resulting bit line contact plug 116 are overhang the upper surface of sealing insulation film 112.

Figure 2D:
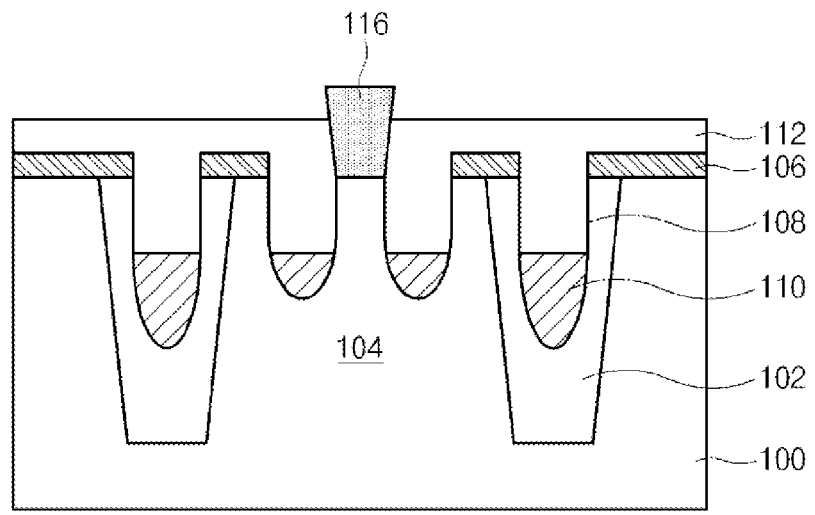

Referring to FIG. 2D, the sacrificial insulation film 114 is removed. In an embodiment, the sacrificial insulation film 114 may be removed using a hydrogen fluoride (HF) solution, and residue remaining on the surface of the bit line contact plug 116 can be removed. As a result, the bit line contact plug 116 protrudes from the surface of the sealing insulation film 112. Although the height of the bit line contact plug 116 is lower than the height of the sacrificial insulation film 114 when forming the bit line contact plug 116, the sacrificial insulation film 114 can be removed, so that the bit line contact plug 116 is protruded from the surface of the sealing insulation film 112.

Figure 2E:
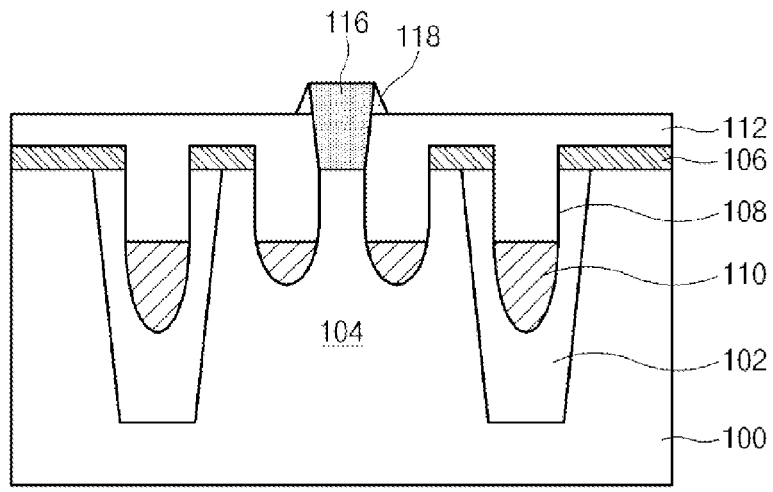

Referring to FIG. 2E, a spacer insulation film is formed over the sealing insulation film 112 including the bit line contact plug 116, and the spacer insulation film is etched back, leaving spacer 118 over sidewalls of the protruding bit line contact plug 116. The shape of spacer 118 may be triangular, so that the outer surface of the spacer 118 is disposed at an incline, creating a sloping transition between the bit line contact plug 116 and the upper surface of sealing insulation film 112 and filling the space under overhanging portions of bit line contact plug 116. In an embodiment, the spacer insulation film may include a silicon nitride (SiN) film.

Figure 2F:
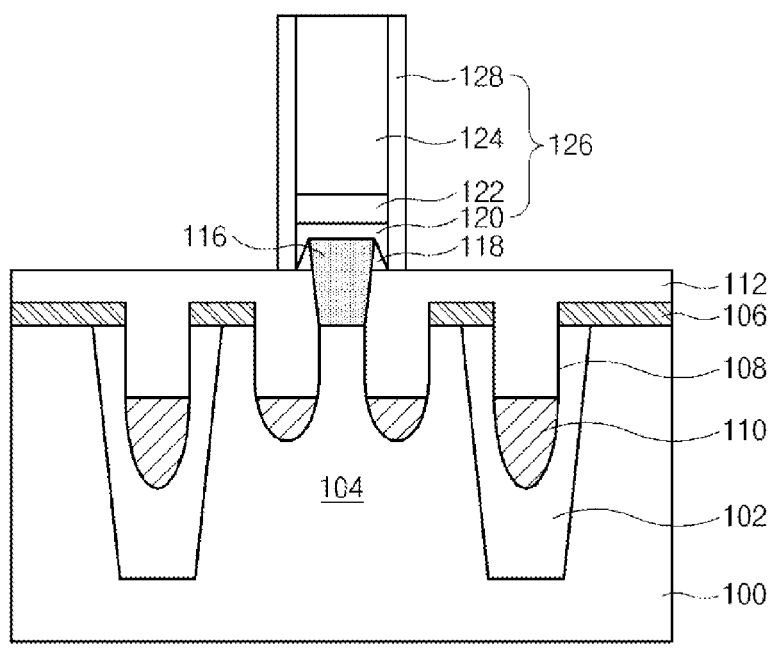

Referring to FIG. 2F, a bit line 126 including a barrier metal layer 120, a bit line metal layer 122, and a hard mask layer 124 are formed over the bit line contact plug 116 and spacer 118. Thereafter, a bit line spacer 128 is formed over sidewalls of the bit line 126.

According to embodiments of the present invention, a bit line contact plug protrudes from a sealing insulation film in such a manner that a barrier metal layer is easily deposited in a subsequent process, thereby preventing oxidation of the barrier metal layer. A protruding bit line contact plug prevents problems associated with contamination being trapped in a hole from etching the bit line contact material, and spacers over sidewalls of the bit line contact plug help step coverage of a subsequently formed barrier metal layer of a bit line. In addition, when a bit line contact hole is misaligned, semiconductor devices according to embodiments of the present invention prevent the bit line contact plug from being damaged, reducing defects associated with high levels of contact resistance.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   a semiconductor substrate including a device isolation film and an active region;
   a bit line contact plug protruding from an upper surface of a sealing insulation film formed over the semiconductor substrate, and coupled to the active region, wherein a width of an upper portion of the contact plug disposed over the sealing insulation film is greater than a width of a lower portion of the contact plug;
   a spacer formed over a sidewall of the protruding bit line contact plug; and
   a bit line coupled to an upper portion of the bit line contact plug.

2. The semiconductor device according to claim 1, further comprising:
   a trench formed in the semiconductor substrate; and
   a buried gate disposed in the trench.

3. The semiconductor device according to claim 2, further comprising:
   a mask insulation film formed to define the trench over the semiconductor substrate.

4. The semiconductor device according to claim 1, wherein the sealing insulation film includes a nitride film.

5. The semiconductor device according to claim 1, wherein the spacer includes a nitride film.

6. The semiconductor device according to claim 1, wherein the spacer has a triangular shape, and an outer surface of the spacer is disposed at an incline with respect to an upper surface of the sealing insulation film.

7. A method for forming a semiconductor device comprising:
   forming a sealing insulation film over a semiconductor substrate including a device isolation film and an active region;
   forming a bit line contact plug protruding from an upper part of the sealing insulation film and coupled to the active region, wherein a width of an upper portion of the contact plug disposed over the sealing insulation film is greater than a width of a lower portion of the contact plug;
   forming a spacer over a sidewall of the bit line contact plug; and
   forming a bit line coupled to the bit line contact plug.

8. The method according to claim 7, further comprising:
   before forming the sealing insulation film, forming a mask insulation film over the semiconductor substrate;
   forming a trench in the semiconductor substrate using the mask insulation film as a mask; and
   forming a buried gate in the trench.

9. The method according to claim 8, wherein the sealing insulation film is further formed over the buried gate.

10. The method according to claim 7, wherein the sealing insulation film includes a nitride film.

11. The method according to claim 7, wherein forming the bit line contact plug includes:

forming a sacrificial insulation film over the sealing insulation film;

forming a bit line contact hole by etching the sacrificial insulation film and the sealing insulation film until the active region is exposed; and forming a conductive material in the bit line contact hole;

etching back the conductive material to form the bit line contact plug; and removing the sacrificial insulation film.

12. The method according to claim 11, wherein the bit line contact hole is etched so that an upper portion of the contact hole has a greater width than a lower portion of the contact hole.

13. The method according to claim 11, wherein the sacrificial insulation film includes an oxide film.

14. The method according to claim 11, wherein the sacrificial insulation film is formed to have a thickness of 400 Å.

15. The method according to claim 11, wherein the sacrificial insulation film is removed using a hydrogen fluoride (HF).

16. The method according to claim 11, wherein forming the spacer over a sidewall of the bit line contact plug includes:

forming a spacer insulation film over the sealing insulation film including the bit line contact plug; and etching back the spacer insulation film.

17. The method according to claim 16, wherein the spacer insulation film includes a nitride film.

18. The method according to claim 16, wherein the spacer insulation film is etched until a triangular shaped portion of the insulation film remains over sidewalls of the bit line contact plug, and an outer surface of the spacer is disposed at an incline with respect to an upper surface of the sealing insulation film.

* * * * *